(12) United States Patent
Lu

(10) Patent No.: US 10,424,569 B2
(45) Date of Patent: Sep. 24, 2019

(54) MICRO LIGHT-EMITTING-DIODE DISPLAY PANEL AND MANUFACTURING METHOD THEREOF

(71) Applicant: Shenzhen China Star Optoelectronics Technology Co., Ltd., Shenzhen (CN)

(72) Inventor: Macai Lu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/285,122

(22) Filed: Feb. 25, 2019

(65) Prior Publication Data

US 2019/0189604 A1 Jun. 20, 2019

Related U.S. Application Data

(62) Division of application No. 15/548,097, filed on Aug. 2, 2017, now Pat. No. 10,269,779.

(30) Foreign Application Priority Data

May 23, 2017 (CN) .......................... 2017 1 0370730

(51) Int. Cl.
*H01L 25/16* (2006.01)
*H01L 25/075* (2006.01)
(Continued)

(52) U.S. Cl.
CPC ........ *H01L 25/167* (2013.01); *H01L 21/6835* (2013.01); *H01L 22/20* (2013.01); *H01L 22/30* (2013.01); *H01L 25/0753* (2013.01); *H01L 27/1214* (2013.01); *H01L 33/0079* (2013.01); *H01L 33/36* (2013.01); *H01L 33/382* (2013.01); *H01L 33/385* (2013.01); *H01L 33/44* (2013.01); *H01L 33/483* (2013.01); *H01L 33/62* (2013.01); *H01L 21/67144* (2013.01);
(Continued)

(58) Field of Classification Search
CPC ......... H01L 22/20; H01L 22/30; H01L 33/36; H01L 33/38; H01L 33/385; H01L 33/62; H01L 25/0753; H01L 25/167; H01L 2933/0016; H01L 2933/0066
See application file for complete search history.

(56) References Cited

U.S. PATENT DOCUMENTS 9,666,764 B2 * 5/2017 Bergmann .......... H01L 33/0079
10,223,962 B2 * 3/2019 Meitl ....................... G09G 3/32
(Continued)

*Primary Examiner* — Victoria K. Hall
(74) *Attorney, Agent, or Firm* — Leong C. Lei

(57) ABSTRACT

The present invention provides a micro light emitting-diode display panel and a manufacturing method thereof. The first electrode contact and the second electrode contact are alternatively disposed on the base substrate of the micro light-emitting-diode display panel, and the first electrode contact and the second electrode contact are respectively connected with the bottom electrode and the connection electrode of the micro light-emitting-diode. The connection electrode is also connected with the top electrode of the micro light-emitting-diode, and the micro light-emitting-diodes can be immediately inspected after the micro-light-emitting-diode is transferred, to reduce the difficulty of detection and product repair, and to improve the product yield.

3 Claims, 9 Drawing Sheets

(51) Int. Cl.
*H01L 21/66* (2006.01)
*H01L 21/683* (2006.01)
*H01L 33/48* (2010.01)
*H01L 33/44* (2010.01)
*H01L 33/38* (2010.01)
*H01L 33/00* (2010.01)
*H01L 33/36* (2010.01)
*H01L 27/12* (2006.01)
*H01L 33/62* (2010.01)
*H01L 21/67* (2006.01)
*H01L 33/20* (2010.01)

(52) U.S. Cl.
CPC .......... *H01L 33/0095* (2013.01); *H01L 33/20* (2013.01); *H01L 2221/68322* (2013.01); *H01L 2221/68354* (2013.01); *H01L 2221/68368* (2013.01); *H01L 2221/68386* (2013.01); *H01L 2933/0016* (2013.01); *H01L 2933/0025* (2013.01); *H01L 2933/0066* (2013.01)

(56) References Cited

U.S. PATENT DOCUMENTS

| | | | |
|---|---|---|---|
| 10,263,138 B2* | 4/2019 | Lu | H01L 25/0753 |
| 10,269,779 B2* | 4/2019 | Lu | H01L 33/62 |
| 2009/0224273 A1* | 9/2009 | Sakamoto | H01L 33/483 |
| | | | 257/98 |
| 2010/0038668 A1* | 2/2010 | Noma | H01L 33/44 |
| | | | 257/98 |
| 2010/0109022 A1* | 5/2010 | Kim | H01L 25/167 |
| | | | 257/84 |
| 2010/0117103 A1* | 5/2010 | Marfeld | H01L 25/0753 |
| | | | 257/91 |
| 2013/0009196 A1* | 1/2013 | Iwanaga | H01L 33/382 |
| | | | 257/99 |
| 2013/0049039 A1* | 2/2013 | Vadhavkar | H01L 33/62 |
| 2014/0159064 A1* | 6/2014 | Sakariya | H01L 25/0753 |
| | | | 257/88 |
| 2014/0159067 A1* | 6/2014 | Sakariya | H01L 24/24 |
| | | | 257/88 |
| 2014/0367633 A1* | 12/2014 | Bibl | G02F 1/133603 |
| | | | 257/13 |
| 2014/0367705 A1* | 12/2014 | Bibl | H01L 33/44 |
| | | | 257/88 |
| 2015/0084054 A1* | 3/2015 | Fan | G02F 1/00 |
| | | | 257/72 |
| 2015/0115293 A1* | 4/2015 | Wu | H01L 27/156 |
| | | | 257/88 |
| 2017/0033268 A1* | 2/2017 | Lee | H01L 33/44 |
| 2017/0062397 A1* | 3/2017 | Park | H01L 27/12 |
| 2017/0069609 A1* | 3/2017 | Zhang | H01L 25/167 |
| 2017/0069611 A1* | 3/2017 | Zhang | H01L 25/0753 |
| 2017/0069612 A1* | 3/2017 | Zhang | G03B 21/005 |
| 2017/0133550 A1* | 5/2017 | Schuele | H01L 33/0079 |
| 2017/0170160 A1* | 6/2017 | Yen | H01L 24/83 |
| 2017/0170373 A1* | 6/2017 | Peng | H01L 27/124 |
| 2017/0229430 A1* | 8/2017 | Lai | H01L 25/0753 |
| 2017/0243772 A1* | 8/2017 | Oh | B32B 37/025 |
| 2017/0243773 A1* | 8/2017 | Hwang | H01L 24/00 |
| 2017/0256522 A1* | 9/2017 | Cok | H01L 25/0753 |
| 2017/0263828 A1* | 9/2017 | Mao | H01L 33/62 |
| 2017/0271312 A1* | 9/2017 | Kwon | H01L 25/0753 |
| 2017/0271548 A1* | 9/2017 | Huang | H01L 22/12 |
| 2017/0278835 A1* | 9/2017 | Jeong | H01L 33/62 |
| 2017/0287789 A1* | 10/2017 | Bower | H01L 25/167 |
| 2017/0294424 A1* | 10/2017 | Jeong | H01L 25/167 |
| 2017/0294480 A1* | 10/2017 | Kwon | H01L 27/1214 |
| 2017/0294565 A1* | 10/2017 | Kim | H01L 25/0753 |
| 2017/0309604 A1* | 10/2017 | Kim | H01L 25/167 |
| 2017/0323873 A1* | 11/2017 | Lin | H01L 24/95 |
| 2017/0338211 A1* | 11/2017 | Lin | H01L 25/167 |
| 2017/0338212 A1* | 11/2017 | Kuo | H01L 25/167 |
| 2017/0345801 A1* | 11/2017 | Lin | H01L 25/0753 |
| 2017/0358505 A1* | 12/2017 | Chang | H01L 22/22 |
| 2018/0012876 A1* | 1/2018 | Kim | H01L 33/42 |
| 2018/0019369 A1* | 1/2018 | Cho | H01L 27/156 |
| 2018/0358339 A1* | 12/2018 | Iguchi | G09F 9/33 |
| 2019/0229149 A1* | 7/2019 | Yoo | H01L 27/156 |

* cited by examiner

MICRO LIGHT-EMITTING-DIODE DISPLAY PANEL AND MANUFACTURING METHOD THEREOF

CROSS REFERENCE TO RELATED APPLICATIONS

This is a divisional application of co-pending U.S. patent application Ser. No. 15/548,097, filed on Aug. 2, 2017, which is a national stage of PCT Application No. PCT/CN2017/089250, filed on Jun. 20, 2017, claiming foreign priority of Chinese Patent Application No. 201710370730.4, filed on May 23, 2017.

FIELD OF INVENTION

The present invention relates to the field of liquid crystal display, and more particularly to a micro light-emitting-diode display panel and a manufacturing method thereof.

DESCRIPTION OF PRIOR ART

Because of the advantages of high quality, power saving, thin body and wide applications, the flat panel display devices have become a mainstream in the display devices and been widely used in various consumer electronic devices, such as mobile phones, personal digital assistants, digital cameras, laptops, and desktop computers.

A micro LED display is a display that achieves image display by using a high density and small size LED arrays integrated on a substrate as display pixels, the same as the large-size outdoor LED display, each pixel can be addressed, be individually driven to light, can be seen as a shrink-down version of the outdoor LED display, to reduce the pixel distance from millimeter to micron. The Micro LED display and the organic light-emitting-diode (OLED) display are self-luminous displays, however, with comparing with OLED display, the Micro LED display has better material stability and longer life than the OLED display, and no image mark like the OLED display, and is considered to be the biggest competitor of the OLED display.

In the manufacturing process of the micro LED display panel, the micro light-emitting-diodes must grow on an original substrate (such as sapphire-type substrate) by the molecular beam epitaxy method, for making the display panel, the micro light-emitting-diode devices should be transferred from the original substrate to a receiving substrate for forming the display panel in a display arrangement. Specifically, the micro light-emitting-diodes are firstly formed on the original substrate, then, the micro light-emitting-diodes are lifted from the original substrate by a laser lift-off (LLO) technology, the micro light-emitting-diodes are adhered from the original substrate to preset positions of the receiving substrate, by using a transfer head which is made of a material such as polydimethylsiloxane (PDMS).

Presently, after the micro light-emitting-diodes are transferred to the receiving substrate, but also a top electrode needs to be formed to determine whether the bonding between the micro light-emitting-diodes and receiving substrate is normal or not. However, because the process has been basically completed at this moment, in this case even if the bonding between the micro light-emitting-diodes and the receiving substrate is poor, it is difficult to repair. Hence, it is needed to provide a new micro LED display panel and a manufacturing method thereof, which is capable of immediately performing the work-condition test of the micro light-emitting-diodes after transferring, to reduce the difficulty of product detection and product repair, and to improve the product yield.

SUMMARY OF THE INVENTION

An object of the present invention is to provide a micro light-emitting-diode display panel, which can reduce the difficulty of product detection and product repair and improve product yield.

An object of the present invention is to further provide a manufacturing for a micro light-emitting-diode display panel, which can reduce the difficulty of product detection and product repair and improve product yield.

In order to achieve the objective, the present invention provides a micro light-emitting-diode display panel, which comprises: a base substrate, a plurality of sub-pixel regions disposing with an array arrangement on the base substrate, a first electrode contact and a second electrode contact alternatively disposing within each of the sub-pixel regions, and a micro light-emitting-diode disposing on the first electrode contact and the second electrode contact within each of the sub-pixel regions.

The micro light-emitting-diode comprises: a bottom electrode contacting with the first electrode contact, an LED semiconductor layer disposing above the bottom electrode and contacting with the bottom electrode, a top electrode disposing on the LED semiconductor layer and contacting with the LED semiconductor layer, an insulation-protective layer surrounding the LED semiconductor layer, and a connection electrode disposing on the insulation-protective layer and connecting with the top electrode and the second electrode contact.

The micro light-emitting-diode display panel further comprises: a TFT layer is disposed between the base substrate, and the first electrode contact and the second electrode contact.

The TFT layer comprises: an active layer disposed on the base substrate, a gate insulating layer covering the active layer and the base substrate, a gate electrode disposed on the gate insulating layer above the active layer, an intermediate insulating layer covering the gate electrode and the gate insulating layer, a source electrode and a drain electrode disposing on the intermediate insulating layer and contacting with two ends of the active layer, and a passivation layer covering the source electrode, the drain electrode and the intermediate insulating layer. The second electrode contact contacts with the source electrode.

The micro light-emitting-diode display panel further comprises: a pixel definition layer disposed on the passivation layer and located around the micro light-emitting-diode, and a protective layer covering the passivation layer, the first electrode contact, the second electrode contact, the micro light-emitting-diode, and the pixel definition layer.

The present invention further provides a method for manufacturing a micro light-emitting-diode display panel, which comprises:

Step 1, an original substrate is provided. A plurality of micro light-emitting-diode semi-finished products disposed alternatively are formed on the original substrate.

Each of the plurality of micro light-emitting-diode semi-products comprises: an LED semi-conductor layer disposed on the original substrate, a first insulating layer covering the LED semi-conductor layer and the original substrate, a bottom electrode disposed on the first insulating layer and contacted with the LED semi-conductor layer, and a connection electrode disposed on the first insulating layer and contacted with the original substrate.

Step 2, a transporting substrate is provided. A surface of the transporting substrate is bonded to the bottom electrode and the connection electrode of each of the micro emitting diode semi-finished products. The original substrate is peeled off, to transfer all of the micro emitting diode semi-finished products to the transporting substrate and to expose a side surface of the LED semi-conductor layer contacted with the original substrate.

Step 3, a second insulating layer and a top electrode disposed on the second insulating layer are orderly formed on the exposed LED semi-conductor layer and the first insulating layer, to obtain a plurality of micro light-emitting-diodes with an interval arrangement. The top electrode is contacted with the LED semi-conductor layer and the connection electrode.

Step 4, a transfer head and a receiving substrate are provided. The receiving substrate comprises: a base substrate, a plurality of sub-pixel regions disposing on the base substrate in an array arrangement, and a first electrode contact and a second electrode contact alternatively disposing within each of the sub-pixel regions.

Step 5, the micro light-emitting-diodes on the transporting substrate are transferred onto the receiving substrate by the transfer head. Each of the sub-pixel regions corresponds to the micro light-emitting-diodes. The bottom electrode and the connection electrode of the micro light-emitting-diodes of each of the sub-pixel regions are respectively bonded to the first electrode contact and the second electrode contact within the sub-pixel region.

Step 6, a test voltage is provided to the first electrode contact and the second electrode contact to test whether the respective micro light-emitting-diodes on the receiving substrate are normally lit or not. If all of the micro light-emitting-diodes on the receiving substrate are normally lit, a protective layer is continuously formed on the micro light-emitting-diodes, the first electrode contact, and the second electrode contact. If the micro light-emitting-diodes on the receiving substrate are not normally lit, the micro light-emitting-diodes which are not normally lit are replaced with new micro light-emitting-diodes. All of the micro light-emitting-diodes on the receiving substrate are re-tested until they are normally lit.

The step S1 specifically comprises:

Step 11, an original substrate is provided. An LED semi-conductor thin film is formed on the original substrate. A patterned first photoresist layer is formed on the LED semi-conductor thin film.

Step 12, the LED semi-conductor thin film is etched with the first photoresist layer as a shielding, to form a plurality of LED semi-conductor layers with an interval arrangement.

Step 13, a first insulating layer is covered on the LED semi-conductor layers and the original substrate. A patterned second photoresist layer is formed on the first insulating layer.

Step 14, the first insulating layer is etched with the second photoresist layer as a shielding, to form a first via and a second via, penetrating through the first insulating layer. The first via and the second via respectively reveals a portion of the LED semiconductor layers and a portion of the original substrate.

Step 15, a first metal thin film is formed on the first insulating layer, the LED semi-conductor layer, and the original substrate. A patterned third photoresist layer is formed on the first metal thin film.

Step 16, the first metal thin film is etched with the third photoresist layer as a shielding, to form a bottom electrode and a connection electrode. The bottom electrode contacts with the LED semi-conductor layer through the first via. The connection electrode contact with the original substrate through the second via.

The transporting substrate in the step 2 is a hard substrate having an adhesive layer on its surface.

The step 3 specifically comprises:

Step 31, a second insulating layer is formed on the LED semi-conductor layer and the first insulating layer. A patterned fourth photoresist layer is formed on the second insulating layer.

Step 32, the second insulating layer is etched with the fourth photoresist layer as a shielding, to form a third via and a fourth via, penetrating through the second insulating layer. The third via and the fourth via respectively reveals a portion of the LED semi-conductor layer and a portion of the connection electrode.

Step 33, a conductive thin film is deposited and patterned on the second insulating layer, to form a top electrode. The top electrode contacts with the LED semi-conductor layer and the connection electrode through the third via and the fourth via, respectively.

The receiving substrate provided in the step S4 further comprises: a TFT layer and a pixel definition layer.

The TFT layer is disposed between the base substrate, and the first electrode contact and the second electrode contact. The TFT layer comprises: an active layer disposed on the base substrate, a gate insulating layer covering the active layer and the base substrate, a gate electrode disposed on the gate insulating layer above the active layer, an intermediate insulating layer covering the gate electrode and the gate insulating layer, a source electrode and a drain electrode disposed on the intermediate insulating layer and contacting with two ends of the active layer, and a passivation layer covering the source electrode, the drain electrode and the intermediate insulating layer; the second electrode contact contacts with the source electrode. The pixel definition layer is disposed on the passivation layer and located around the micro light-emitting-diodes.

At least two bonding positions are preset on the first electrode contact and the second electrode contact. When the micro light-emitting-diodes which are not normally lit, are replaced with the new micro light-emitting-diodes in the step 6, the micro light-emitting-diodes after a replacement and the micro light-emitting-diodes before replacement are in different bonding positions.

The original substrate is peeled off by a laser stripping process in step 2.

The present invention further provides a method for manufacturing a micro light-emitting-diode display panel, which comprises:

Step 1, an original substrate is provided. A plurality of micro light-emitting-diode semi-finished products disposed alternatively are formed on the original substrate.

Each of the plurality of micro light-emitting-diode semi-products comprises: an LED semi-conductor layer disposed on the original substrate, a first insulating layer covering the LED semi-conductor layer and the original substrate, a bottom electrode disposed on the first insulating layer and contacted with the LED semi-conductor layer, and a connection electrode disposed on the first insulating layer and contacted with the original substrate.

Step 2, a transporting substrate is provided. A surface of the transporting substrate is bonded to the bottom electrode and the connection electrode of each of the micro emitting diode semi-finished products. The original substrate is peeled off, to transfer all of the micro emitting diode semi-finished products to the transporting substrate and to expose a side surface of the LED semi-conductor layer contacted with the original substrate.

Step 3, a second insulating layer and a top electrode disposed on the second insulating layer are orderly formed on the exposed LED semi-conductor layer and the first insulating layer, to obtain a plurality of micro light-emitting-diodes with an interval arrangement. The top electrode is contacted with the LED semi-conductor layer and the connection electrode.

Step 4, a transfer head and a receiving substrate are provided. The receiving substrate comprises: a base substrate, a plurality of sub-pixel regions disposing on the base substrate in an array arrangement, and a first electrode contact and a second electrode contact alternatively disposing within each of the sub-pixel regions.

Step 5, the micro light-emitting-diodes on the transporting substrate are transferred onto the receiving substrate by the transfer head. Each of the sub-pixel regions corresponds to the micro light-emitting-diodes. The bottom electrode and the connection electrode of the micro light-emitting-diodes of each of the sub-pixel regions are respectively bonded to the first electrode contact and the second electrode contact within the sub-pixel region.

Step 6, a test voltage is provided to the first electrode contact and the second electrode contact to test whether the respective micro light-emitting-diodes on the receiving substrate are normally lit or not. If all of the micro light-emitting-diodes on the receiving substrate are normally lit, a protective layer is continuously formed on the micro light-emitting-diodes, the first electrode contact, and the second electrode contact. If the micro light-emitting-diodes on the receiving substrate are not normally lit, the micro light-emitting-diodes which are not normally lit are replaced with new micro light-emitting-diodes. All of the micro light-emitting-diodes on the receiving substrate are re-tested until they are normally lit.

Wherein the step S1 specifically comprises:

Step 11, an original substrate is provided. An LED semi-conductor thin film is formed on the original substrate. A patterned first photoresist layer is formed on the LED semi-conductor thin film.

Step 12, the LED semi-conductor thin film is etched with the first photoresist layer as a shielding, to form a plurality of LED semi-conductor layers with an interval arrangement.

Step 13, a first insulating layer is covered on the LED semi-conductor layers and the original substrate. A patterned second photoresist layer is formed on the first insulating layer.

Step 14, the first insulating layer is etched with the second photoresist layer as a shielding, to form a first via and a second via, penetrating through the first insulating layer. The first via and the second via respectively reveals a portion of the LED semiconductor layers and a portion of the original substrate.

Step 15, a first metal thin film is formed on the first insulating layer, the LED semi-conductor layer, and the original substrate. A patterned third photoresist layer is formed on the first metal thin film.

Step 16, the first metal thin film is etched with the third photoresist layer as a shielding, to form a bottom electrode and a connection electrode. The bottom electrode contact with the LED semi-conductor layer through the first via. The connection electrode contacts with the original substrate through the second via.

Wherein the transporting substrate in the step 2 is a hard substrate having an adhesive layer on its surface.

The beneficial effects of the present invention is: the present invention provides a micro light-emitting-diode display panel. A first electrode contact and a second electrode contact are disposed alternatively on a base substrate of the micro light-emitting-diodes display panel. The first electrode contact and the second electrode contact are respectively in contact with the bottom electrode and the connection electrode of the micro light-emitting-diodes. The connection electrode is also in contact with the top electrode of the micro light-emitting-diodes, and the micro light-emitting-diodes can be immediately detected after the micro light-emitting-diodes are transferred, to reduce the difficulty of product detection and product repair, and to improve the product yield. The invention also provides a method for manufacturing a micro light-emitting-diode display panel, which is capable of immediately detecting the micro light-emitting-diodes after the micro light-emitting-diodes are transferred, to reduce the difficulty of product detection and product repair, and to improve the product yield.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

The technical proposals and the effects of the present invention will be described in further detail with reference to the below preferred embodiments of the present invention and their accompanying drawings.

Figure 15:
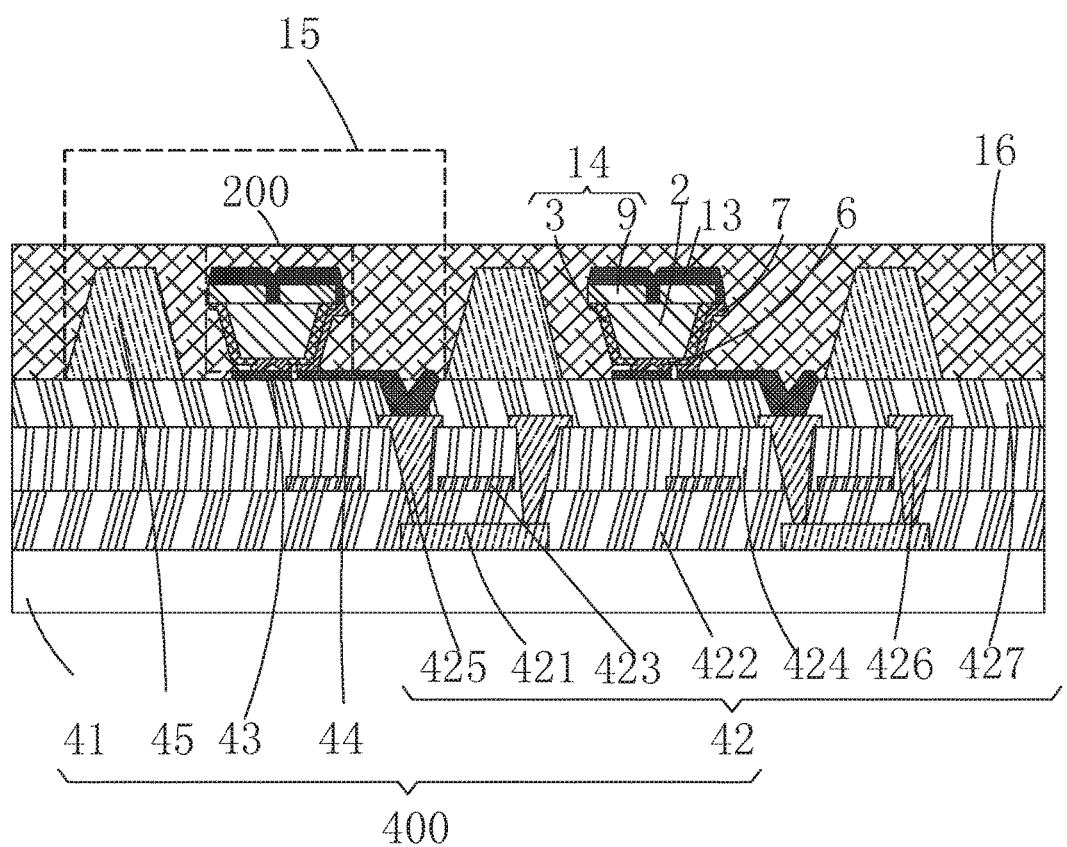
FIG. 15 is illustrative diagram of the step S6 of a method for manufacturing a micro light-emitting-diode display panel according to the present invention and also a structural illustrative diagram of the micro light-emitting-diode display panel according to the present invention.

Please refer to FIG. 15, the present invention provides a micro light-emitting-diode display panel, which comprises: a base substrate 41, a plurality of sub-pixel regions 15 disposed an array arrangement on the base substrate 41, a first electrode contact 43 and a second electrode contact 44 alternatively disposed within each of the sub-pixel regions 15, and a micro light-emitting-diode 200 disposed on the first electrode contact 43 and the second electrode contact 44 within each of the sub-pixel regions 15.

The micro light-emitting-diode 200 comprises: a bottom electrode 6 contacting the first electrode contact 43, an LED semiconductor layer 2 disposed above the bottom electrode 6 and contacting with the bottom electrode 6, a top electrode 13 disposed on the LED semiconductor layer 2 and contacting with the LED semiconductor layer 2, an insulation-protective layer 14 surrounding the LED semiconductor layer 2, and a connection electrode 7 disposed on the insulation-protective layer 14 and connecting the top electrode 13 and the second electrode contact 44.

Specifically, the micro light-emitting-diode display panel further comprises: a TFT layer 42 is disposed between the base substrate 41, and the first electrode contact 43 and the second electrode contact 44. The TFT layer 42 comprises: an active layer 421 disposed on the base substrate 41, a gate insulating layer 422 covering the active layer 421 and the base substrate 41, a gate electrode 423 disposed on the gate insulating layer 422 above the active layer 421, an intermediate insulating layer 424 covering the gate electrode 423 and the gate insulating layer 422, a source electrode 425 and a drain electrode 426 disposed on the intermediate insulating layer 424 and contacting with two ends of the active layer 421, and a passivation layer 427 covering the source electrode 425, the drain electrode 426 and the intermediate insulating layer 424. The second electrode contact 44 contacts with the source electrode 425.

Specifically, the micro light-emitting-diode display panel further comprises: a pixel definition layer 45 disposed on the passivation layer 427 and located around the micro light-emitting-diode 200, and a protective layer 16 covering the passivation layer 427, the first electrode contact 43, the second electrode contact 44, the micro light-emitting-diode 200, and the pixel definition layer 45.

Specifically, the protective layer 16 has a function of enhancing the light extraction of the micro light-emitting-diode 200, and the protective layer 16 has a good heat transfer capability.

Specifically, the LED semiconductor layer 2 comprises an N+ layer, a P+ layer, and a multi-quantum well layer in contact with the N+ layer and the P+ layer. The material of the bottom electrode 6 and the connection electrode 7 may be selected from at least one of nickel (Ni), molybdenum (Mo), aluminum (Al), gold (Au), platinum (Pt), and titanium (Ti). The top electrode 13 is a transparent electrode, which is made from indium tin oxide (ITO), indium zinc oxide (IZO), or a mixture of polyethylene dioxythiophene and polystyrene sulfonic acid (PEDOT: PSS). The insulation-protective layer 14 is made from silicon oxide (SiOx), silicon nitride (SiNx), or alumina ($Al_2O_3$).

It is to be noted that, with that the top electrode 13 and the second electrode contact 44 are connected by the connection electrode 7 in the micro light-emitting-diode display panel of the present invention, the top electrode 13 can be immediately formed before the micro light-emitting-diodes are transferred, the micro light-emitting-diodes 200 can directly perform the lighting test of the micro light-emitting-diodes 200 after the micro light-emitting-diodes 200 is transferred, and when the micro light-emitting-diodes 200 are determined as being normal lit, and then manufacturing can continue to other structures such as the protective layer 16, thereby decreasing the difficulty of product defect detection and product repair and improving the product yield.

Figure 17:
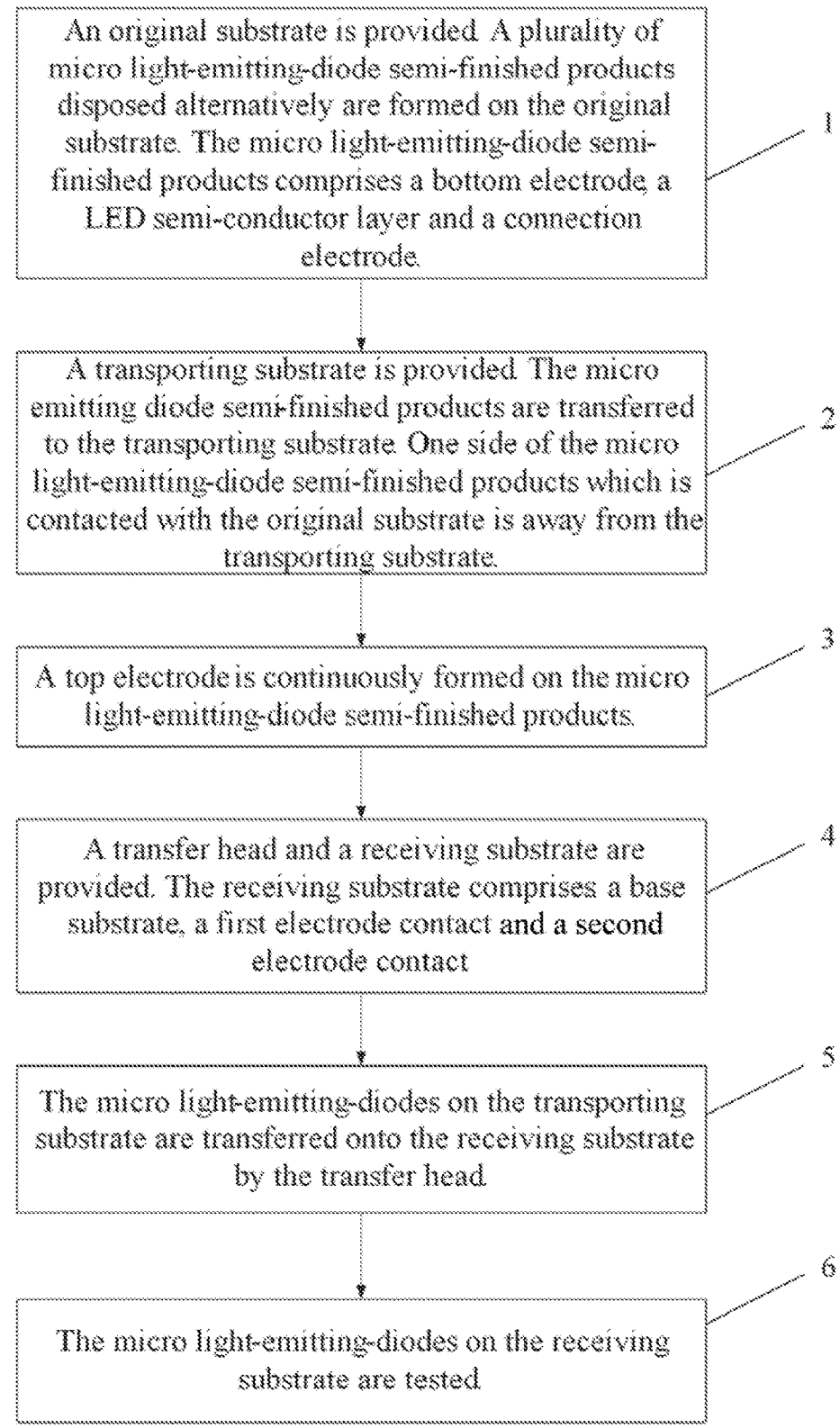
FIG. 17 is a flow diagram of a method for manufacturing a micro light-emitting-diode display panel according to the present invention.

Please refer to FIG. 17, the present invention further provides a flow diagram of a method for manufacturing a micro light-emitting-diode display panel, which comprises:

Step 1, an original substrate 1 is provided. A plurality of micro light-emitting-diode semi-finished products 100 disposed alternatively are formed on the original substrate 1.

Each of the plurality of micro light-emitting-diode semi-products comprises 100: an LED semi-conductor layer 2 disposed on the original substrate 1, a first insulating layer 3 covering the LED semi-conductor layer 2 and the original substrate 1, a bottom electrode 6 disposed on the first insulating layer 3 and contacted with the LED semi-conductor layer 2, and a connection electrode 7 disposed on the first insulating layer 3 and contacted with the original substrate 1.

Figure 1:
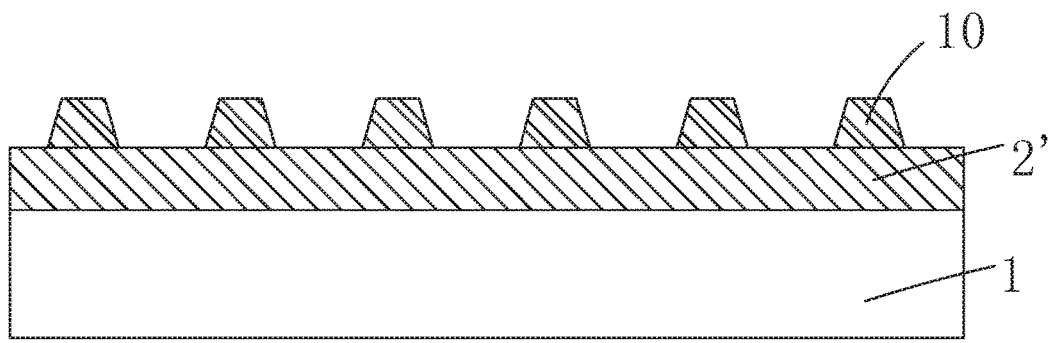
FIGS. 1-8 are illustrative diagrams of the step S1 of a method for manufacturing a micro light-emitting-diode display panel according to the present invention.

Specifically, the step S1 specifically comprises:

Step 11, please refer to FIG. 1, an original substrate 1 is provided. An LED semi-conductor thin film 2' is formed on the original substrate 1. A patterned first photoresist layer 10 is formed on the LED semi-conductor thin film 2'.

Figure 2:
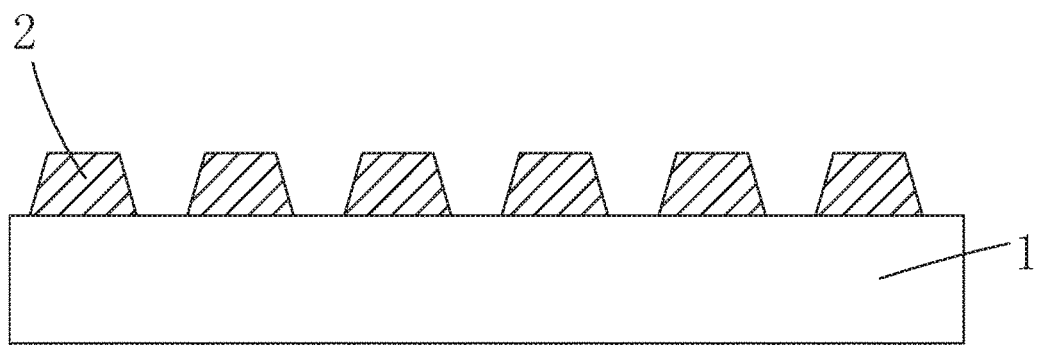

Step 12, please refer to FIG. 2, the LED semi-conductor thin film 2' is etched with the first photoresist layer 10 as a shielding, to form a plurality of LED semi-conductor layers 2 with an interval arrangement.

Figure 3:
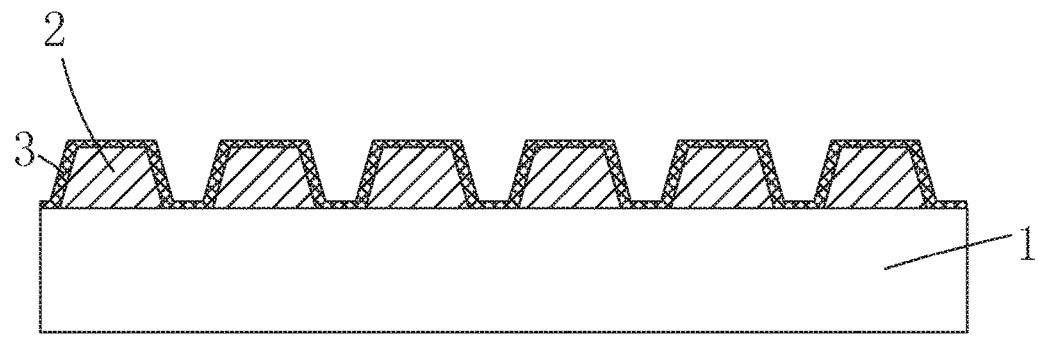
Figure 4:
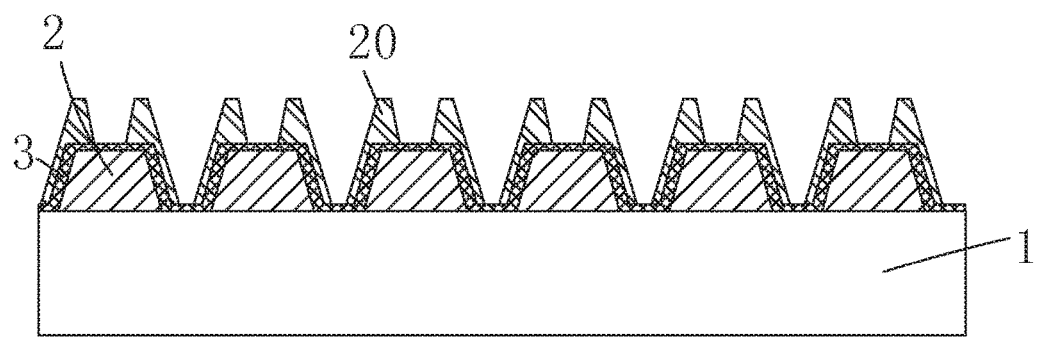

Step 13, please refer to FIGS. 3 and 4, a first insulating layer 3 is covered on the LED semi-conductor layers 2 and the original substrate 1. A patterned second photoresist layer 20 is formed on the first insulating layer 3.

Figure 5:
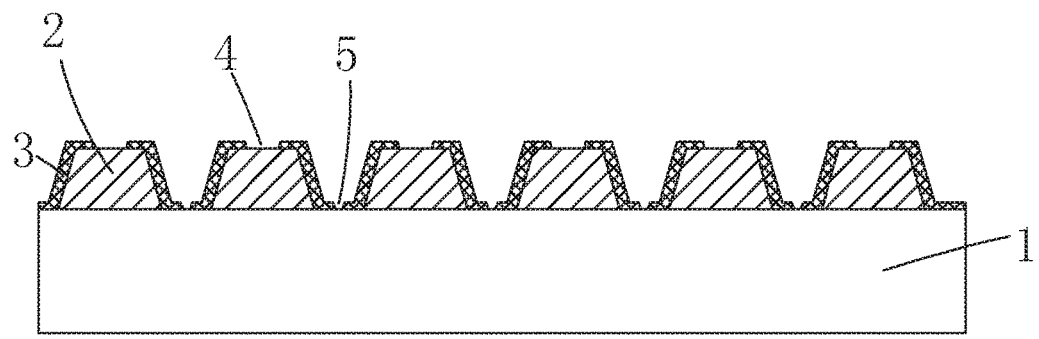

Step 14, please refer to FIG. 5, the first insulating layer 3 is etched with the second photoresist layer 20 as a shielding, to form a first via 4 and a second via 5, penetrating through the first insulating layer 3. The first via 4 and the second via 5 respectively reveals a portion of the LED semiconductor layers 2 and a portion of the original substrate 1.

Figure 6:
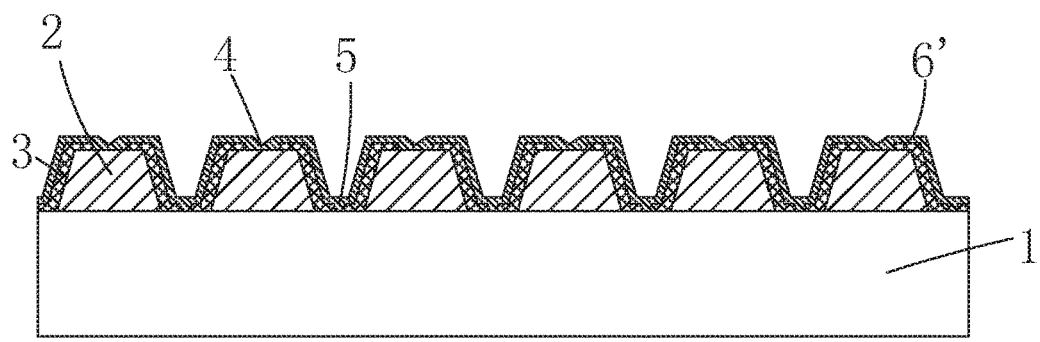
Figure 7:
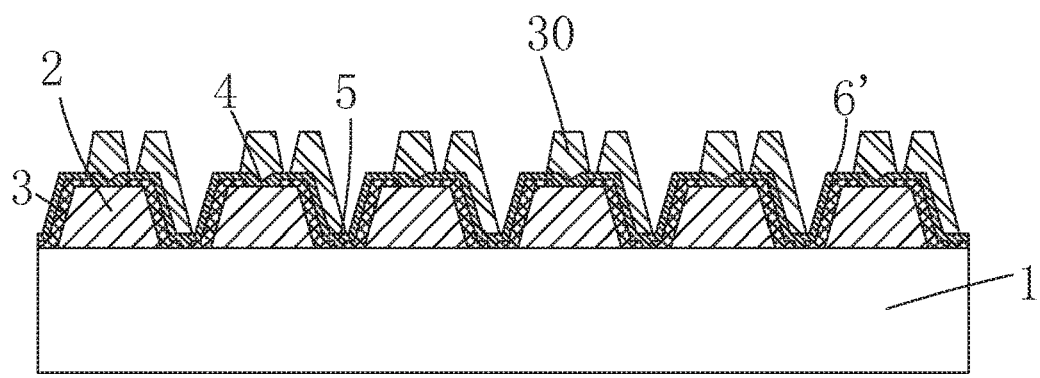

Step 15, please refer to FIGS. 6 and 7, a first metal thin film 6' is formed on the first insulating layer 3, the LED semi-conductor layer 2, and the original substrate 1. A patterned third photoresist layer 30 is formed on the first metal thin film 6'.

Figure 8:
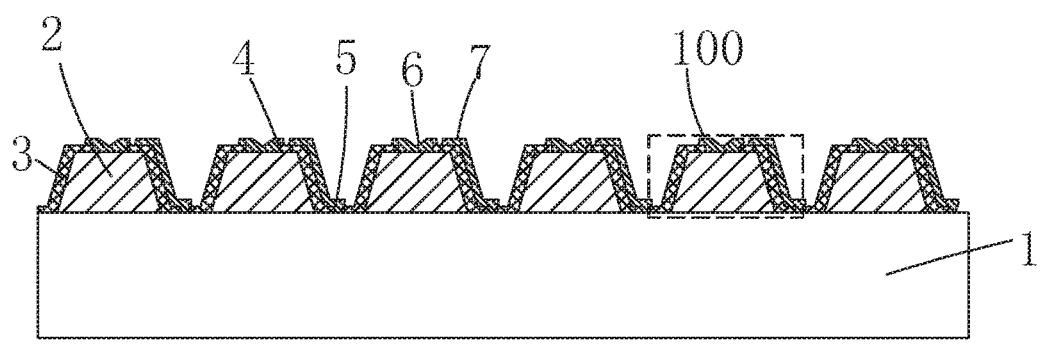
Figure 9:
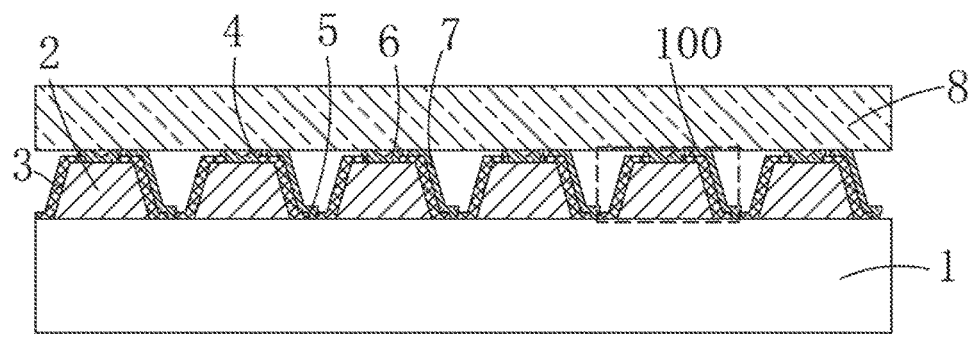
FIG. 9 is illustrative diagram of the step S2 of a method for manufacturing a micro light-emitting-diode display panel according to the present invention.

Step 16, please refer to FIG. 8, the first metal thin film 6' is etched with the third photoresist layer 30 as a shielding, to form a bottom electrode 6 and a connection electrode 7. The bottom electrode 6 contacts with the LED semi-conductor layer 2 through the first via 4. The connection electrode 7 contacts with the original substrate 1 through the second via 5.

Specifically, the original substrate 1 is a sapphire substrate ($Al_2O_3$), a silicon substrate (S1), a silicon carbide substrate (SiC), or a gallium nitride substrate (GaN), and the like. The LED semiconductor layer 2 includes an N+ layer, a P+ layer and a multi-quantum well layer in contact with the N+ and P+ layers. The material of the bottom electrode 6 and the connection electrode 7 may be a combination of one or more of metals such as nickel, molybdenum, aluminum, gold, platinum, and titanium. The material of the first insulating layer 3 is silicon oxide, silicon nitride, or alumina and the like.

Step 2, a transporting substrate 8 is provided. A surface of the transporting substrate 8 is bonded to the bottom electrode 6 and the connection electrode 7 of each of the micro emitting diode semi-finished products 100. The original substrate 1 is peeled off, to transfer all of the micro emitting diode semi-finished products 100 to the transporting substrate 8 and to expose a side surface of the LED semi-conductor layer 2 contacted with the original substrate 1.

Specifically, the transporting substrate 8 in the step 2 is a hard substrate having an adhesive layer on its surface. With the adhesive layer on the surface of the hard substrate to adhere the bottom electrode 6 and the connection electrode 7, the micro emitting diode semi-finished products 100 and the transporting substrate 8 are adhered. The original substrate 1 is peeled off with a Laser lift-off (LLO) technology, to transfer the micro emitting diode semi-finished products 100 to the transporting substrate 8 and to expose the side surface of the LED semi-conductor layer 2 contacted with the original substrate 1.

Specifically, the step 2 further comprises: the transporting substrate 8 and the semi-finished product 100 of the micro-emitter diode on the transporting substrate 8 are reversed, so that the exposed side of the LED semiconductor layer 2 faces upwards, facilitating the subsequent process.

Step 3, a second insulating layer 9 and a top electrode 13 disposed on the second insulating layer 9 are orderly formed on the exposed LED semi-conductor layer 2 and the first insulating layer 3, to obtain a plurality of micro light-emitting-diodes 200 with an interval arrangement. The top electrode 13 is contacted with the LED semi-conductor layer 2 and the connection electrode 7.

Specifically, the first insulating layer 3 and the second insulating layer 9 together constitute an insulation-protective layer 14 surrounding the LED semiconductor layer 2.

Figure 10:
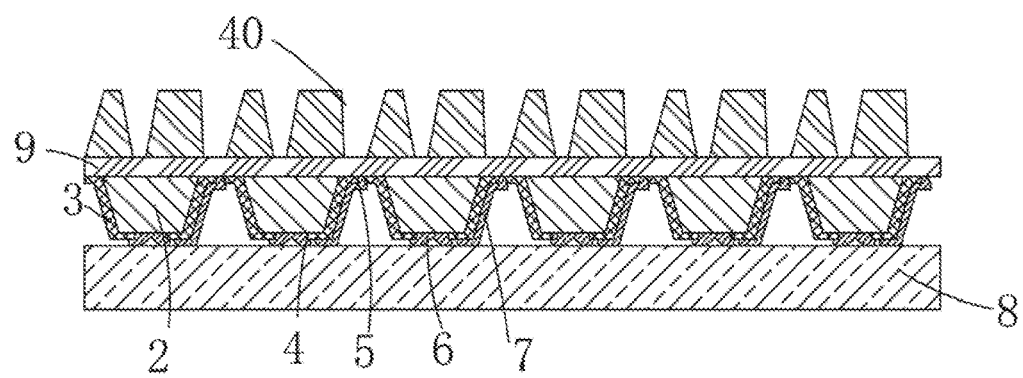
FIGS. 10-12 are illustrative diagrams of the step S3 of a method for manufacturing a micro light-emitting-diode display panel according to the present invention.

Specifically, the step S3 specifically comprises: step 31, please refer to FIG. 10, a second insulating layer 9 is formed on the LED semi-conductor layer 2 and the first insulating layer 3. A patterned fourth photoresist layer 40 is formed on the second insulating layer 9.

Figure 11:
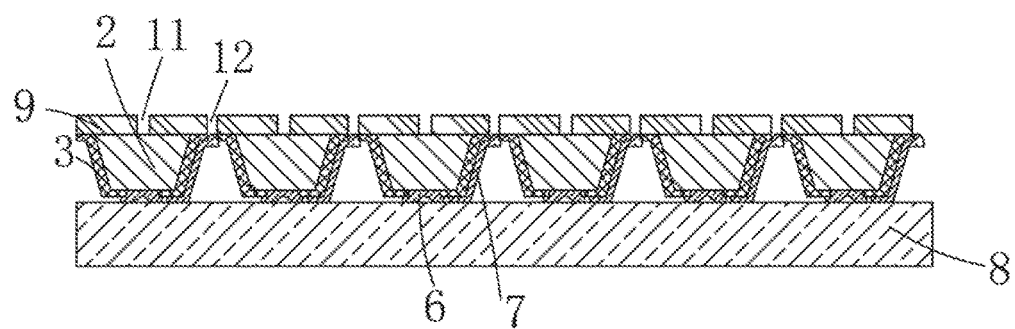

Step 32, please refer to FIG. 11, the second insulating layer 9 is etched with the fourth photoresist layer 40 as a shielding, to form a third via 11 and a fourth via 12, penetrating through the second insulating layer 9. The third via 11 and the fourth via 12 respectively reveals a portion of the LED semi-conductor layer 2 and a portion of the connection electrode 7.

Figure 12:
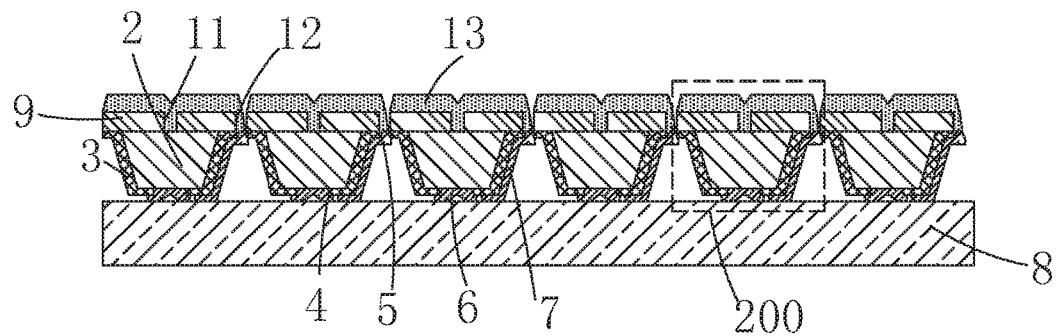

Step 33, please refer to FIG. 12, a conductive thin film is deposited and patterned on the second insulating layer 9, to form a top electrode 13. The top electrode 13 contacts with the LED semi-conductor layer 2 and the connection electrode 7 through the third via 11 and the fourth via 12, respectively.

Figure 13:
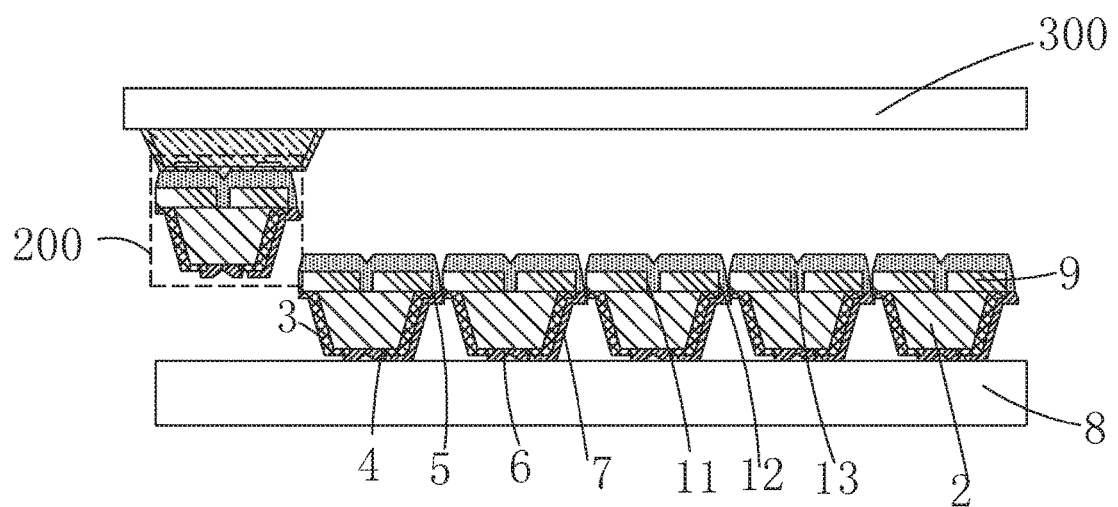
FIGS. 13 and 14 are illustrative diagrams of the step S4 and the step S5 of a method for manufacturing a micro light-emitting-diode display panel according to the present invention.
Figure 14:
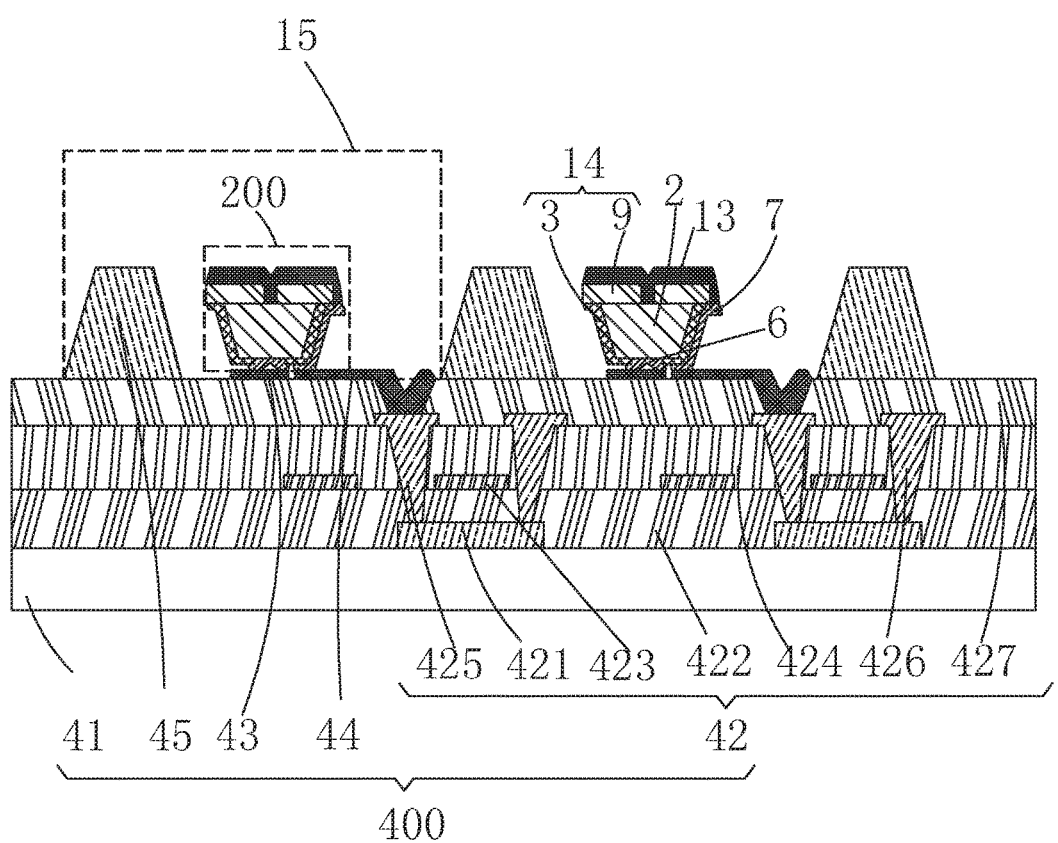

Step 4, please refer to FIGS. 13 and 14, a transfer head 300 and a receiving substrate 400 are provided. The receiving substrate 400 comprises: a base substrate 41, a plurality of sub-pixel regions 15 disposed on the base substrate 41 in an array arrangement, and first electrode contact 43 and second electrode contact 44 alternatively disposed within each of the sub-pixel regions 15.

Specifically, the receiving substrate 400 provided in the step S4 further comprises: a TFT layer 42 and a pixel definition layer 45. The TFT layer 42 is disposed between the base substrate 41, and the first electrode contact 43 and the second electrode contact 44. The TFT layer 42 comprises: an active layer 421 disposed on the base substrate 41, a gate insulating layer 422 covering the active layer 421 and the base substrate 41, a gate electrode 423 disposed on the gate insulating layer 422 above the active layer 421, an intermediate insulating layer 424 covering the gate electrode 423 and the gate insulating layer 422, a source electrode 425 and a drain electrode 426 disposed on the intermediate insulating layer 424 and contacting with two ends of the active layer 421, and a passivation layer 427 covering the source electrode 425, the drain electrode 426 and the intermediate insulating layer 424. The second electrode contact 44 contacts the source electrode 425. The pixel definition layer 45 is disposed on the passivation layer 427 and located around the micro light-emitting-diodes 200.

Step 5, please refer to FIG. 14, the micro light-emitting-diodes 200 on the transporting substrate 8 are transferred onto the receiving substrate 400 by the transfer head 300. Each of the sub-pixel regions 15 corresponds to the micro light-emitting-diodes 200. The bottom electrode 6 and the connection electrode 7 of the micro light-emitting-diodes 200 of each of the sub-pixel regions 15 are respectively bonded to the first electrode contact 43 and the second electrode contact 44 within the sub-pixel region 15.

Figure 16:
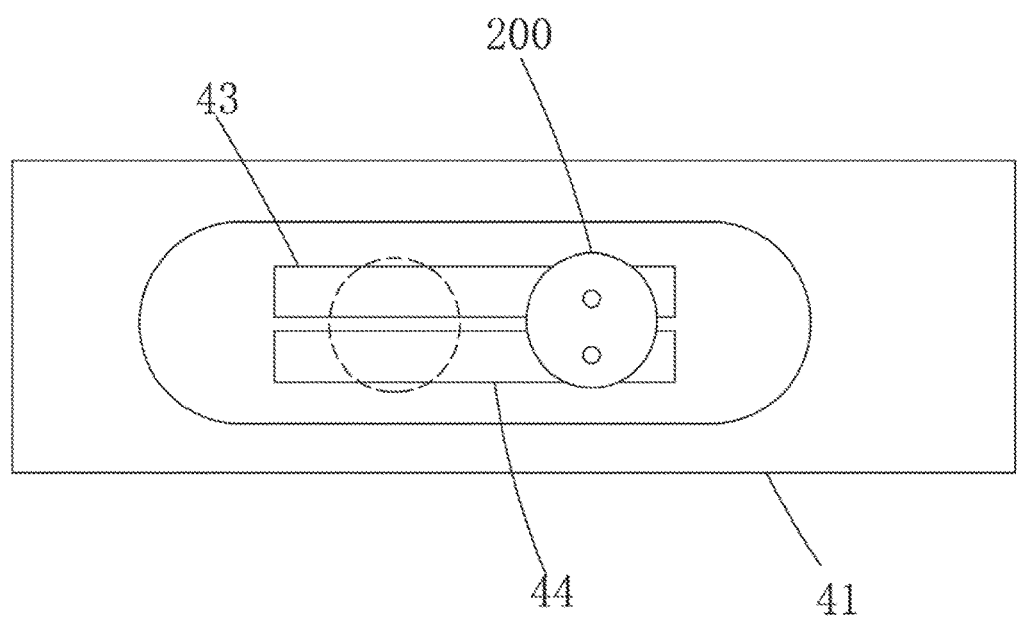
FIG. 16 is top-view illustration of the step S6 of a method for manufacturing a micro light-emitting-diode display panel according to the present invention.

Step 6, please refer to FIGS. 15 and 16, a test voltage is provided to the first electrode contact 43 and the second electrode contact 44 to test whether the respective micro light-emitting-diodes 200 on the receiving substrate 400 are normally lit or not. If all of the micro light-emitting-diodes 200 on the receiving substrate 400 are normally lit, a protective layer 16 is continuously formed on the micro light-emitting-diodes 200, the passivation layer 427, the pixel definition layer 45, the first electrode contact 43, and the second electrode contact 44. If the micro light-emitting-diodes 200 on the receiving substrate 400 are not normally lit, the micro light-emitting-diodes 200 which are not normally lit are replaced with new micro light-emitting-diodes 200. All of the micro light-emitting-diodes 200 on the receiving substrate 400 are re-tested until they are normally lit.

Specifically, the protective layer 16 has a function of enhancing the light extraction of the micro light-emitting-diodes 200, and the protective layer 16 has a good heat transfer capability.

It is to be noted that the micro-light emitting diode display panel of the present invention firstly manufactures a semi-finished product 100 including a bottom electrode 6, an LED semiconductor layer 2, and a micro-light-emitting-diode connecting the electrode 7 on the original substrate 1, then, the semi-finished product 100 is transferred onto the transport substrate 8 and is inverted upside down, and then the top electrode 13 connected to both the LED semiconductor layer 2 and the connection electrode 7 is formed to obtain the micro light-emitting-diodes 200, and finally the micro light-emitting-diodes 200 is transferred onto the receiving substrate 400 so that the bottom electrode 6 and the connection electrode 7 are in contact with the first electrode contact 43 and the second electrode contact 44, respectively, so that after the micro light-emitting-diodes 200 are transferred, without any process, the lighting test of the light-emitting-diodes 200 can immediately be performed, and other structures such as the protective layer 16 can be continuously manufactured after the micro light-emitting-diodes 200 are determined as normally lit, thereby reducing the difficulty of detection and product repair, and improving the product yield.

As mentioned above, the present invention provides a micro light-emitting-diode display panel. A first electrode contact and a second electrode contact are disposed alternatively on a base substrate of the micro light-emitting-diodes display panel. The first electrode contact and the second electrode contact are respectively in contact with the bottom electrode and the connection electrode of the micro light-emitting-diodes. The connection electrode is also in contact with the top electrode of the micro light-emitting-diodes, and the micro light-emitting-diodes can be immediately detected after the micro light-emitting-diodes are transferred, to reduce the difficulty of product detection and product repair, and to improve the product yield.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A micro light-emitting-diode display panel, comprising a base substrate, a plurality of sub-pixel regions disposed in an array arrangement on the base substrate, a first electrode contact and a second electrode contact alternatively disposed within each of the sub-pixel regions, and a micro light-emitting-diode disposed on the first electrode contact and the second electrode contact within each of the sub-pixel regions;

the micro light-emitting-diode comprising: a bottom electrode contacting the first electrode contact, an LED semiconductor layer disposed above the bottom electrode and contacting the bottom electrode, a top electrode disposed on the LED semiconductor layer and contacting the LED semiconductor layer, an insulation-protective layer surrounding the LED semiconductor layer, and a connection electrode disposed on the insulation-protective layer and connecting the top electrode and the second electrode contact.

2. The micro light-emitting-diode display panel according to claim 1, further comprising: a TFT layer disposed between the base substrate, and the first electrode contact and the second electrode contact;

the TFT layer comprising: an active layer disposed on the base substrate, a gate insulating layer covering the active layer and the base substrate, a gate electrode disposed on the gate insulating layer above the active layer, an intermediate insulating layer covering the gate electrode and the gate insulating layer, a source electrode and a drain electrode disposed on the intermediate insulating layer and contacting two ends of the active layer, and a passivation layer covering the source electrode, the drain electrode and the intermediate insulating layer; the second electrode contact contacting the source electrode.

3. The micro light-emitting-diode display panel according to claim 2, further comprising: a pixel definition layer disposed on the passivation layer and located around the micro light-emitting-diode, and a protective layer covering the passivation layer, the first electrode contact, the second electrode contact, the micro light-emitting-diode, and the pixel definition layer.

* * * * *